US008420444B2

(12) United States Patent
Tani et al.

(10) Patent No.: US 8,420,444 B2
(45) Date of Patent: Apr. 16, 2013

(54) SEMICONDUCTOR DEVICE AND METHOD OF MANUFACTURING THE SAME

(75) Inventors: Motoaki Tani, Kawasaki (JP); Shinya Iijima, Kawasaki (JP); Shinichi Sugiura, Kobe (JP); Hiromichi Watanabe, Kobe (JP)

(73) Assignees: Fujitsu Limited, Kawasaki (JP); Fujitsu Ten Limited, Kobe-shi (JP)

( * ) Notice: Subject to any disclaimer, the term of this patent is extended or adjusted under 35 U.S.C. 154(b) by 112 days.

(21) Appl. No.: 13/028,419

(22) Filed: Feb. 16, 2011

(65) Prior Publication Data

US 2011/0233765 A1 Sep. 29, 2011

(30) Foreign Application Priority Data

Mar. 26, 2010 (JP) ................................ 2010-071831

(51) Int. Cl.
*H01L 23/492* (2006.01)
*H01L 21/52* (2006.01)
*H01L 23/498* (2006.01)

(52) U.S. Cl.
USPC ............ 438/108; 438/615; 438/113; 438/120

(58) Field of Classification Search .................. 438/121, 438/122; 257/734, 737; 356/635
See application file for complete search history.

(56) References Cited

U.S. PATENT DOCUMENTS

| | | | | |
|---|---|---|---|---|
| 6,518,163 | B2 * | 2/2003 | Sakuyama et al. | 438/613 |
| 6,927,489 | B1 | 8/2005 | Yaguchi | |
| 7,514,788 | B2 * | 4/2009 | Kobae et al. | 257/738 |
| 2002/0094601 | A1 * | 7/2002 | Su et al. | 438/106 |
| 2004/0232543 | A1 * | 11/2004 | Goller et al. | 257/700 |
| 2005/0127504 | A1 * | 6/2005 | Imai | 257/734 |

FOREIGN PATENT DOCUMENTS

| | | | |
|---|---|---|---|
| JP | 4024958 | B2 | 10/2007 |
| JP | 2008-172228 | * | 7/2008 |

* cited by examiner

*Primary Examiner* — Olik Chaudhuri
*Assistant Examiner* — Wilner Jean Baptiste
(74) *Attorney, Agent, or Firm* — Kratz, Quintos & Hanson, LLP

(57) ABSTRACT

A semiconductor device includes a first bump that is located over a surface of a semiconductor element, and is formed on a first bump formation face distanced from a back surface of the semiconductor element at a first distance, and a second bump that is located over the surface of the semiconductor element, and is formed on a second bump formation face distanced from the back surface of the semiconductor element at a second distance being longer than the first distance, the second bump having a diameter larger than a diameter of the first bump.

10 Claims, 13 Drawing Sheets

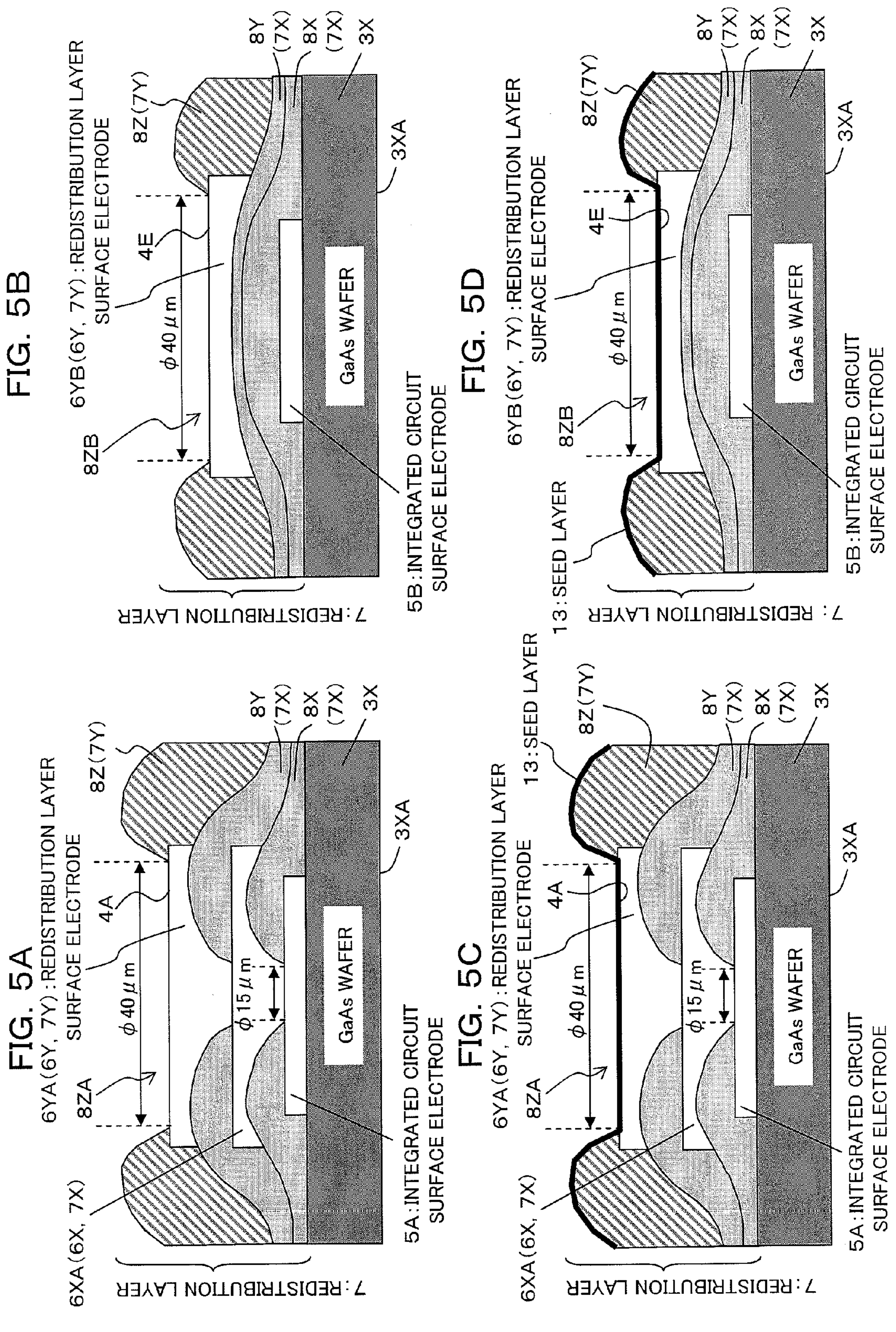
FIG. 5A
6YA(6Y, 7Y):REDISTRIBUTION LAYER SURFACE ELECTRODE
6XA(6X, 7X)
8ZA
φ40μm
φ15μm
4A
8Z(7Y)
8Y (7X)
8X (7X)
3X
3XA
GaAs WAFER
5A:INTEGRATED CIRCUIT SURFACE ELECTRODE
7:REDISTRIBUTION LAYER
FIG. 5B
6YB(6Y, 7Y):REDISTRIBUTION LAYER SURFACE ELECTRODE
8ZB
φ40μm
4E
8Z(7Y)
8Y (7X)
8X (7X)
3X
3XA
GaAs WAFER
5B:INTEGRATED CIRCUIT SURFACE ELECTRODE
7:REDISTRIBUTION LAYER
FIG. 5C
6YA(6Y, 7Y):REDISTRIBUTION LAYER SURFACE ELECTRODE
6XA(6X, 7X)
13:SEED LAYER
8ZA
φ40μm
φ15μm
4A
8Z(7Y)
8Y (7X)
8X (7X)
3X
3XA
GaAs WAFER
5A:INTEGRATED CIRCUIT SURFACE ELECTRODE
7:REDISTRIBUTION LAYER
FIG. 5D
6YB(6Y, 7Y):REDISTRIBUTION LAYER SURFACE ELECTRODE
13:SEED LAYER
8ZB
φ40μm
4E
8Z(7Y)
8Y (7X)
8X (7X)
3X
3XA
GaAs WAFER
5B:INTEGRATED CIRCUIT SURFACE ELECTRODE
7: REDISTRIBUTION LAYER

FIG. 10

| BUMP NO. | BUMP LOCATION | DUMP DIAMETER ($\mu$m) | BONDING AREA ($\mu m^2$) | BUMP SHEAR STRENGTH (N) | EVALUATION |
|---|---|---|---|---|---|
| 1 | THICKNESS FROM TIP BACK SURFACE IS SMALLER THAN OTHERS | 30 | 930 | 0.22 | GOOD |
| 2 | | | 898 | 0.23 | GOOD |
| 3 | | | 922 | 0.22 | GOOD |
| 4 | | | 858 | 0.23 | GOOD |
| 5 | | | 895 | 0.24 | GOOD |
| 6 | | | 908 | 0.21 | GOOD |
| 7 | THICKNESS FROM TIP BACK SURFACE IS GREATER THAN OTHERS | 40 | 1155 | 0.25 | GOOD |
| 8 | | | 1190 | 0.27 | GOOD |
| 9 | | | 1172 | 0.27 | GOOD |
| 10 | | | 1250 | 0.31 | GOOD |
| 11 | | | 1198 | 0.28 | GOOD |
| 12 | | | 1204 | 0.30 | GOOD |

FIG. 11

| BUMP NO. | BUMP LOCATION | DUMP DIAMETER ($\mu$m) | BONDING AREA ($\mu m^2$) | BUMP SHEAR STRENGTH (N) | EVALUATION |
|---|---|---|---|---|---|
| 1 | THICKNESS FROM TIP BACK SURFACE IS SMALLER THAN OTHERS | 30 | 925 | 0.23 | GOOD |
| 2 | | | 883 | 0.24 | GOOD |
| 3 | | | 947 | 0.22 | GOOD |
| 4 | | | 933 | 0.22 | GOOD |
| 5 | | | 875 | 0.24 | GOOD |
| 6 | | | 948 | 0.21 | GOOD |
| 7 | THICKNESS FROM TIP BACK SURFACE IS GREATER THAN OTHERS | | 455 | 0.11 | NG |
| 8 | | | 390 | 0.09 | NG |
| 9 | | | 372 | 0.10 | NG |
| 10 | | | 360 | 0.11 | NG |
| 11 | | | 398 | 0.08 | NG |
| 12 | | | 404 | 0.10 | NG |

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2010-71831, filed on Mar. 26, 2010, the entire contents of which are incorporated herein by reference.

FIELD

The embodiment discussed herein is related to a semiconductor device and a method of manufacturing the same.

BACKGROUND

With downsizing of electronic devices, flip-chip mounting techniques have become widely used, for mounting electronic components, e.g., semiconductor devices, directly on a mounting board, for densely mounting the electronic components.

As low-cost bonding techniques, there is a technique using metal bumps, e.g., plating bumps and stud bumps formed over semiconductor elements or wafer level packages, and bonding under a force, for example.

SUMMARY

According to an aspect of the embodiment, a semiconductor device includes: a semiconductor element; a first bump that is located over a surface of the semiconductor element, and is formed on a first bump formation face distanced from a back surface of the semiconductor element at a first distance; and a second bump that is located over the surface of the semiconductor element, and is formed on a second bump formation face distanced from the back surface of the semiconductor element at a second distance being longer than the first distance, the second bump having a diameter larger than a diameter of the first bump.

According to another aspect of the embodiment, a method of manufacturing a semiconductor device includes: forming a first bump that is located over a surface of the semiconductor element, on a first bump formation face distanced from a back surface of the semiconductor element at a first distance, and a second bump that is located over the surface of the semiconductor element, on a second bump formation face distanced from the back surface of the semiconductor element at a second distance being longer than the first distance, the second bump having a diameter larger than a diameter of the first bump; and bonding the first and second bumps and a surface electrode of a mounting board together.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIGS. 5A-5D are schematic cross-sectional views illustrating the first specific example of a method of manufacturing a semiconductor device according to one embodiment;

FIG. 10 is a diagram illustrating results of a reliability evaluation of a semiconductor device manufactured with the first specific example of a method of manufacturing a semiconductor device according to one embodiment;

FIG. 11 is a diagram illustrating results of a reliability evaluation of a semiconductor device manufactured with a comparative example of the first specific example of a method of manufacturing a semiconductor device according to one embodiment;

DESCRIPTION OF EMBODIMENT

Figure 12:
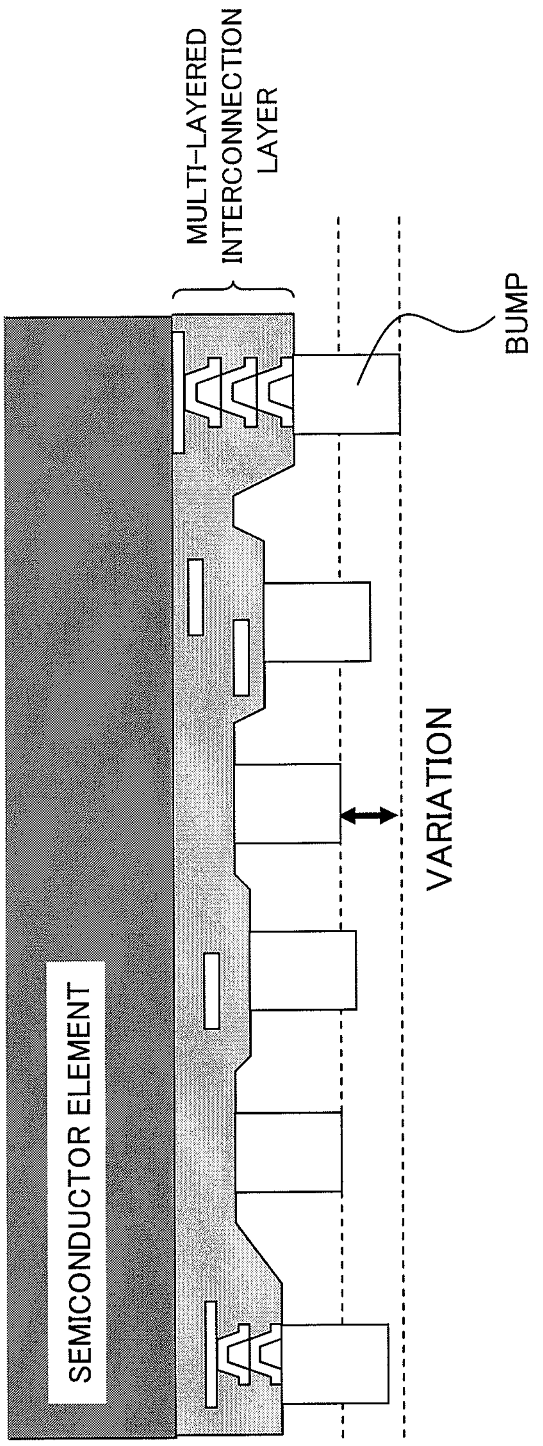
FIG. 12 is a schematic cross-sectional view illustrating the problems of the embodiment.

Now, reference is made to FIG. 12. As depicted, in some cases, the positions of the tops of a plurality of bumps having the equal height formed over a multi-layered interconnection layer formed over a semiconductor element, i.e., the magnitudes of protrusion of the bumps, may vary and thus may not be located on the same plane, since the surface of the multi-layered interconnection layer is not flat, that is, the surface has steps. Similarly, when the plurality of bumps having the equal height are formed over a semiconductor element without having a multi-layered interconnection layer between the semiconductor element and the bumps, the positions of the tops of bumps may also vary.

Figure 13:
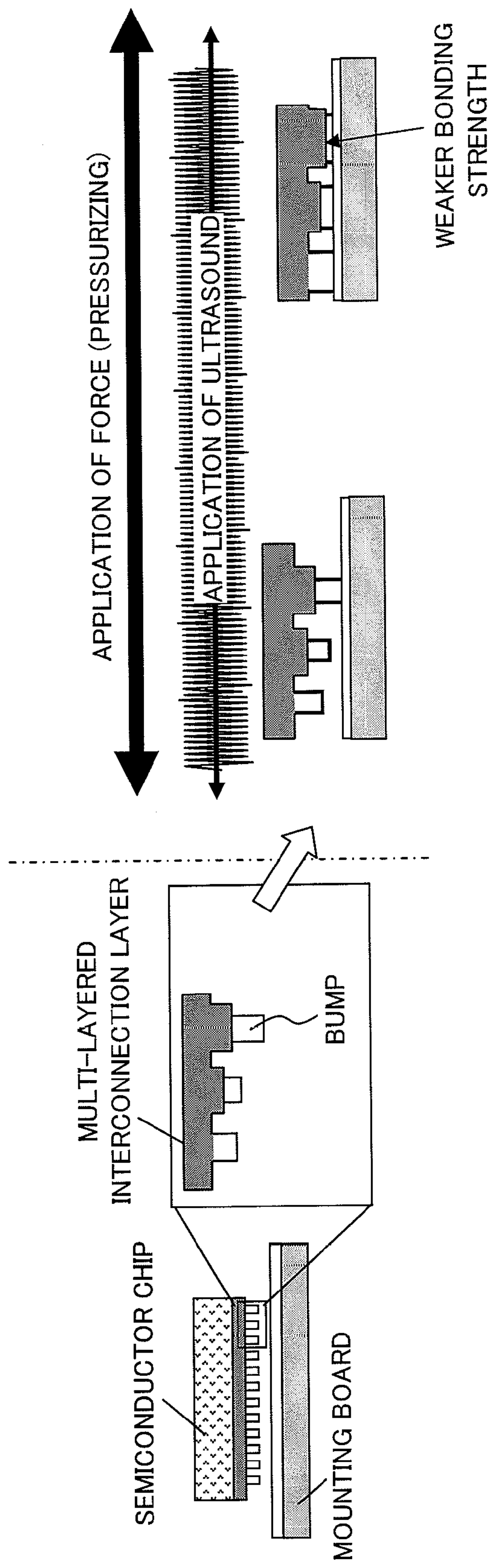
FIG. 13 is a schematic view illustrating the problems of the embodiment.

In such a case, during bonding, the bumps contact a mounting board at different times, with the most protruding bumps contacting the first, as depicted in FIG. 13. During bonding to a mounting board under a force, if the force is adjusted such that the least protruding bump is bonded to have an optimal bonding strength, bumps protruding larger than the least protruding bump would undergo excessive force, which results in insufficient bonding strengths. Particularly, the most protruding bump would undergo excessive force, and its bonding strength would become weaker.

For example, in ultrasonic bonding, bumps protruding larger than the least protruding bump, particularly, the most protruding bump, undergo excessive force and the vibration generated by the ultrasounds is prevented from traveling to such bumps. This reduces the grinding between bumps and the electrodes of the mounting board, preventing generation of fresh metal faces. This prevents the bumps protruding larger than the least protruding bump, especially, the most protruding bump, from undergoing metal bond, resulting in weaker bonding strengths, causing insufficient bonding strengths.

Therefore, obtaining sufficient bonding strengths for all bumps is desired when bonding to a mounting board even in the case where the positions of the tops of the bumps, i.e., the magnitudes of protrusion of the bumps, vary.

Hereinafter, a semiconductor device and a method of manufacturing the same according to one embodiment will be described with reference to FIGS. 1-11.

Figure 1:
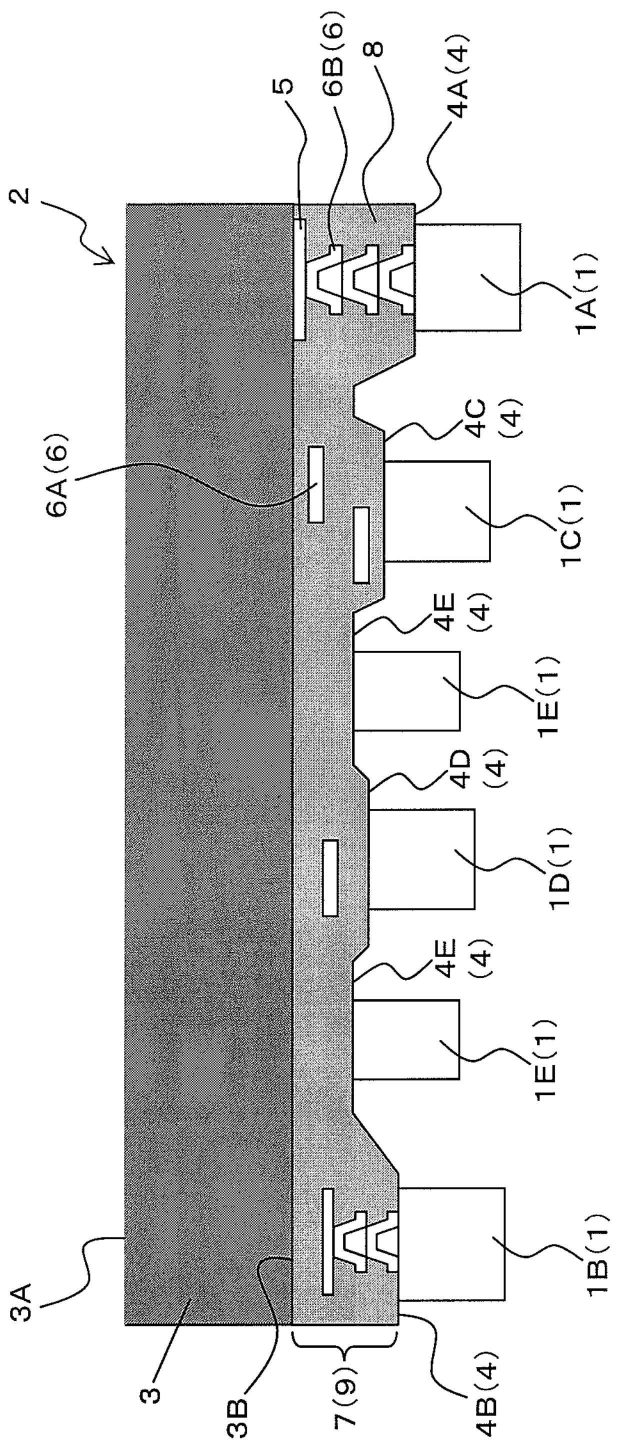
FIG. 1 is a schematic cross-sectional view illustrating the structure of a semiconductor device (semiconductor chip) according to one embodiment.

A semiconductor device according to one embodiment is a semiconductor chip 2 including a plurality of bumps 1 (1A-1E), as depicted in FIG. 1. More specifically, this semiconductor device is the semiconductor chip 2 having a semiconductor element 3 and the bumps 1 (1A-1E) having different diameters, which are located over the surface of the semiconductor element 3, and are formed on a plurality of bump formation faces 4 (4A-4E) distanced from the back surface 3A of the semiconductor element 3 at varied distances. Note that the semiconductor element 3 is sometimes referred to as a "semiconductor device".

The semiconductor element 3 includes an integrated circuit (not illustrated) and a surface electrode 5. The semiconductor element 3 is a semiconductor element, made from a semiconductor material, such as gallium arsenide or silicon, for example.

In this embodiment, the semiconductor chip 2 includes an interconnection layer 7 including at least one conductor layer 6 over the semiconductor element 3. In other words, the semiconductor chip 2 includes the interconnection layer 7 between the semiconductor element 3 and the bumps 1. Thus, the bump formation faces 4 are located on the surface of the interconnection layer 7. In this embodiment, a multi-layered interconnection layer is provided as the interconnection layer 7. The interconnection layer 7 also includes an interconnection 6A and an interconnection electrode (via) 6B, as a conductor layer 6, and further includes a protection layer 8 made from a photosensitive polybenzoxazole or photosensitive polyimide, for example.

In this embodiment, the semiconductor chip 2 is a semiconductor chip having a wafer level package (WLP) 9. Note that the wafer level package 9 is also referred to as a wafer level chip size package (WL-CSP) or a chip size package (CSP).

Here, the semiconductor chip 2 having the wafer level package 9 is formed by forming the interconnection layer 7 including at least one conductor layer 6 at wafer level, followed by dicing the wafer into individual chips. For example, after forming a multi-layered interconnection layer 7, e.g., a redistribution layer, over the surface electrode 5 of the semiconductor element 3 (wafer) made from a semiconductor material, such as silicon or gallium arsenide, the wafer is diced into individual chips.

Accordingly, the semiconductor chip 2 having the wafer level package 9 is a semiconductor chip having a package 9 that is equally sized to the chip, over the semiconductor element 3. In other words, the semiconductor chip 2 having the wafer level package 9 is a semiconductor chip having the interconnection layer 7 including at least one conductor layer 6, as the package 9 that is equally sized to the chip, over the semiconductor element 3. In such a case, each of the bump formation faces 4A-4E is located on the surface of the package 9 (the interconnection layer 7). Thus, the semiconductor chip 2 having the wafer level package 9 includes the interconnection layer 7 between the semiconductor element 3 and the bumps 1.

Although reference is made to the semiconductor chip 2 including the interconnection layer 7, particularly the wafer level package, the semiconductor chip 2 may not include interconnection layer or wafer level package. For example, the semiconductor chip 2 may be a bare chip.

The bumps 1 are plating bumps (gold plating bumps, in this example) formed with metal plating (gold plating, in this example). Note that the bumps 1 are preferably metal bumps including at least gold or copper. For example, the bumps 1 may be stud bumps formed from metal wires. For forming bumps with different diameters economically, metal plating bumps formed with plating are preferred. More specifically, the bumps 1A-1E having different diameters, which will be described later, can be formed economically by forming metal plating bumps using a photolithographically patterned resist.

The plurality of bumps 1A-1E are formed so as to have the equal height. However, the heights of the bumps 1A-1E may be deviated within the tolerable deviation rate of plated bumps. For example, the deviation of the heights of the bumps 1A-1E may fall within 10% of the bump height. In such a case, the difference between the height of one bump (first bump), and the height of another bump (second bump) is within 10% of the height of the first bump or the height of the second bump.

In contrast, since the surface of the semiconductor element 3 or the surface of the interconnection layer 7 formed over the semiconductor element 3 is not flat (has steps), the distances of the plurality of bump formation faces 4A-4E, on which the plurality of bumps 1A-1E are formed, from the back surface 3A of the semiconductor element 3, are varied. Thus, even if the heights of the bumps 1A-1E is within the tolerable deviation rate of plated bumps, the magnitudes of protrusion of the bumps 1A-1E go out of the tolerable deviation rate of plated bumps. That is, the plurality of bumps 1A-1E include, at least two bumps having the difference of the magnitudes of protrusion from the surface 3B of the semiconductor element 3, i.e., the difference of the distances from the surface 3B of the semiconductor element 3 to the tops (the positions of the tops) of the bumps, of larger than 10% of the bump height. Furthermore, the plurality of bumps 1A-1E include, at least two bumps having the difference of the magnitudes of protrusion from the back surface 3A of the semiconductor element 3, i.e., the difference of the distances (device heights) from the back surface 3A of the semiconductor element 3 to the tops (the positions of the tops) of the bumps, of larger than 10% of the bump height.

There are five different distances of the bump formation faces 4A-4E from the back surface 3A the semiconductor element 3 in this embodiment, i.e., there are five steps. Such distances are grouped into three, and thus the bumps 1A-1E having three different diameters (bump diameters) are formed. In other words, the distances of the bump formation faces 4A-4E from the back surface 3A of the semiconductor element 3 are grouped into three, and as the distance increases, the corresponding bump diameter is increased in three steps. In such a case, the bumps 1D and 1C formed on the bump formation faces 4D and 4C, distanced from the back surface 3A of the semiconductor element 3 at the second and third smallest distances, will have a diameter larger than that of the bump 1E formed on the bump formation face 4E, the least distanced from the back surface 3A of the semiconductor element 3. The bumps 1A and 1B formed on the bump formation faces 4A and 4B, distanced from the back surface 3A of the semiconductor element 3 at the largest and the second largest distances, will have a diameter larger than that of the bumps 1D and 1C formed on the bump formation faces 4D and 4C, distanced from the back surface 3A of the semiconductor element 3 at the second and third smallest distances. Note that the bumps 1A-1E are not limited to have circular or oval shapes, and they may have polygon shapes. In such case, the diagonal line of a polygon is used as the bump diameter.

The above diameters of the bumps 1A-1E are not limiting, and the diameters of the bumps 1A-1E may be varied in accordance with the distances of the bump formation faces 4A-4E from the back surface 3A of the semiconductor element 3, i.e., the magnitudes of protrusion of the bumps 1A-1E.

For example, the diameters of the plurality of bumps 1A-1E may be increased in accordance with the distance between the back surface 3A of the semiconductor element 3 and the bump formation faces 4A-4E. In other words, the larger magnitude of protrusion of a bump becomes, the larger the bump diameter may be set. In such a case, the bumps 1A-1E formed on the bump formation faces 4C-4E differently distanced from the back surface 3A of the semiconductor element 3 will have respectively different diameters.

Alternatively, only the diameter of the bump 1A formed on the bump formation face 4A, distanced from the back surface 3A of the semiconductor element 3 at the largest distance, may be increased, for example. In other words, the bumps 1B-1E formed on the bump formation faces 4B-4E other than the bump formation face 4A, distanced from the back surface 3A of the semiconductor element 3 at the largest distance, may be formed such that the bumps 1B-1E have the equal diameter and that the diameter of the bump 1A formed on the bump formation face 4A, distanced from the back surface 3A of the semiconductor element 3 at the largest distance, is larger than the bump diameter of the bumps 1B-1E.

Alternatively, the bumps 1A-1D formed on the bump formation faces 4A-4D other than the bump formation face 4E, distanced from the back surface 3A of the semiconductor element 3 at the smallest distance, may be formed such that the bumps 1A-1D have the equal diameter that is larger than the diameter of the bump 1E formed on the bump formation face 4E, distanced from the back surface 3A of the semiconductor element 3 at the smallest distance, for example.

Alternatively, at least the diameters of bumps having a magnitude of protrusion from the surface 3B of the semiconductor element 3 larger than the magnitude of protrusion obtained by adding the amount corresponding to 10% of the bump height to the magnitude of protrusion of the bump 1E formed on the bump formation face 4E, distanced from the back surface 3A of the semiconductor element 3 at the smallest distance, from the surface 3B of the semiconductor element 3, may be increased, for example. In other words, at least the diameters of bumps having a distance from the surface 3B of the semiconductor element 3 to the top (the position of the top) of the bump larger than the distance obtained by adding the amount corresponding to 10% of the bump height to the distance of the bump 1E formed on the bump formation face 4E, distanced from the back surface 3A of the semiconductor element 3 at the smallest distance, from the surface 3B of the semiconductor element 3 to the top of the bump, may be increased, for example.

Alternatively, at least the diameters of bumps having a magnitude of protrusion from the back surface 3A of the semiconductor element 3 larger than the magnitude of protrusion obtained by adding the amount corresponding to 10% of the bump height to the magnitude of protrusion of the bump 1E formed on the bump formation face 4E, distanced from the back surface 3A of the semiconductor element 3 at the smallest distance, from the back surface 3A of the semiconductor element 3, may be increased, for example. In other words, at least the diameters of bumps having a distance from the back surface 3A of the semiconductor element 3 to the top (the position of the top) of the bump larger than the distance obtained by adding the amount corresponding to 10% of the bump height to the distance of the bump 1E formed on the bump formation face 4E, distanced from the back surface 3A of the semiconductor element 3 at the smallest distance, from the back surface 3A of the semiconductor element 3 to the top of the bump, may be increased, for example.

As described above, among the plurality of bumps 1A-1E, at least the bump 1A formed on the bump formation face 4A, distanced from the back surface 3A of the semiconductor element 3 at the largest distance, may have a diameter larger than those of the other bumps 1B-1E.

In short, assuming that a second distance is longer than a first distance, for increasing bonding areas, a second bump formed on a second bump formation face, which is distanced from the back surface 3A of the semiconductor element 3 at the second distance, may be configured to have a greater diameter than that of a first bump formed on a first bump formation face, which is distanced from the back surface 3A of the semiconductor element 3 at the first distance. Furthermore, assuming that a third distance is shorter than the first distance, a third bump formed on a third bump formation face, which is distanced from the back surface 3A of the semiconductor element 3 at the third distance, may be configured to have a smaller diameter than that of the first bump.

In this manner, for bonding of the bumps 1 of the semiconductor chip 2 and the electrodes of the mounting board, the bumps 1 contacting the electrodes of the mounting board ahead of the other bumps are configured to have greater diameters than the other bumps contacting the electrodes of the mounting board later. In this embodiment, for bonding of the bumps 1 of the semiconductor chip 2 and the electrodes of the mounting board, the bump diameters of the bumps are increased according to the time sequence of contact with the corresponding electrode of the mounting board. More specifically, the bump 1A contacting its corresponding electrode of the mounting board first is configured to have a larger diameter than that of the bump 1E contacting its corresponding electrode last.

The reason why the diameters of the bumps 1A-1E are varied in accordance with the distances of the bump formation faces 4A-4E from the back surface 3A of the semiconductor element 3, i.e., the magnitudes of protrusion of the bumps 1A-1E, will be described.

If a plurality of bumps 1A-1E having the equal height are formed over a semiconductor element 3 for mounting a semiconductor chip 2 including the plurality of bumps 1A-1E on a mounting board, the tops (the positions of the tops) of the bumps 1A-1E, i.e., the magnitudes of protrusion of the bumps 1A-1E may vary, due to unevenness of the surface of the semiconductor element 3, or the surface of the interconnection layer 7 formed over the semiconductor element 3, and thus the tops (the positions of the tops) of the bumps 1A-1E may not be located on the same plane. For example, in a semiconductor chip 2 including a multi-layered interconnection layer 7 between the semiconductor element 3 and the bumps 1A-1E, the bonding heights, i.e., the heights from the boundary face between the semiconductor element 3 and the multi-layered interconnection layer 7 to the tops of bumps 1A-1E (i.e., the bonding height to the mounting board), may vary.

Since the bumps 1 are formed over the surface of the semiconductor element 3 or the surface of the interconnection layer 7 formed over the semiconductor element 3, the surface of the semiconductor element 3 or the surface of the interconnection layer 7 formed over the semiconductor element 3 underlies the bumps 1. The surface of the semiconductor element 3 or the surface of the interconnection layer 7 formed over the semiconductor element 3 underlying the bumps 1 is not flat (has steps). For example, for a semiconductor chip 2 including the interconnection layer 7, e.g., a multi-layered interconnection layer, such as the semiconductor chip 2 having a wafer level package 9, the surface of the interconnection layer 7 becomes uneven since the thickness of the interconnection layer 7 vary across this layer, depending on the number of an interconnection 6A and an interconnection electrode 6B (which are collectively referred to as a "conductor layer") stacked in the respective regions of the interconnection layer 7. Especially in the case where the semiconductor element 3 is a high-frequency device made from gallium arsenide or the like, for example, the thickness of the multi-layered interconnection layer 7 increases around the device, since signal inputs/outputs concentrate around the device, thereby deteriorating the steps (unevenness) of the surface of the multi-layered interconnection layer 7. In addition, for a semiconductor chip 2 of a bare chip, for example, the surface of the semiconductor element 3 becomes uneven due to the variation of the heights of the surface electrodes, for example.

As described above, if the tops (the positions of the tops) of the bumps 1A-1E vary, the bumps contact a mounting board at different times during bonding, with the most protruding bumps contacting the first. During bonding to a mounting board under a force, if the force is adjusted such that the least protruding bump is bonded to have an optimal bonding strength, bumps protruding larger than the least protruding bump would undergo excessive force, which results in insufficient bonding strengths.

For example, in an ultrasonic bonding in which bonding is carried out under application of a force and ultrasounds, a fresh metal face is generated by grinding the bumps 1 and the electrodes of the mounting board under the vibration of the ultrasounds, thereby causing metal bond. During such an ultrasonic bonding, bumps protruding larger than the least protruding bump undergo excessive force and vibration generated by the ultrasounds are prevented from traveling to such bumps. This reduces the grinding between the bumps 1 and the electrodes of the mounting board, preventing generation of fresh metal faces. This prevents the bumps protruding larger than the least protruding bump from undergoing metal bond, resulting in insufficient bonding strengths.

To address varied excessive forces depending on the magnitudes of protrusion of the bumps 1, this embodiment varies the diameters of the bumps 1 in accordance with the distances of the bump formation faces 4 from the back surface 3A of the semiconductor element 3, i.e., the magnitudes of protrusion of the bumps 1. Since at least the most protruding bumps 1A undergoes excessive force, among the plurality of bumps 1A-1E, the diameter of at least the bump 1A formed on the bump formation face 4A, distanced from the back surface 3A of the semiconductor element 3 at the largest distance, is set to be larger than the diameters of the other bumps 1B-1E. Thus, the bonding areas of the bumps 1 undergoing excessive force can be increased, thereby increasing the bonding strengths of the bumps 1 undergoing the excessive force.

In this embodiment, the number of bumps 1A-1D for increasing the bump diameter is minimized, i.e., only the diameters of the bumps 1A-1D undergoing excessive force are increased to increase the bonding areas, thereby enhancing the bonding strengths. In other words, the reliability of the bump bonds across the device is improved by increasing the diameters of the bumps 1A-1D undergoing excessive force. It is also possible to increase diameters of all bumps, rather than increasing the diameters of selected bumps. In recent years, however, semiconductor elements have been provided with an increasing number of terminals while the pitches between the terminals have been narrowed, which renders the strategy of increasing diameters of all bumps disadvantageous.

Figure 2A:
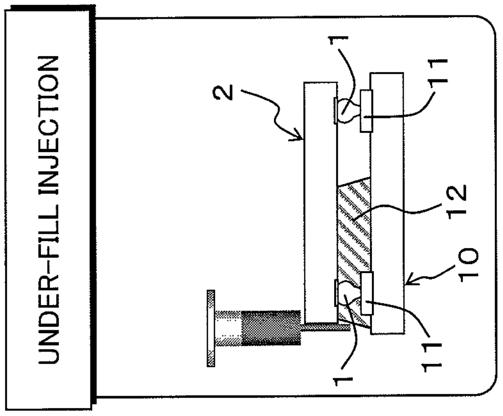
FIGS. 2A and 2B are schematic cross-sectional views illustrating the structure of a semiconductor device (having a semiconductor chip is mounted on a mounting board) according to one embodiment, and a method of manufacturing the same.
Figure 2B:
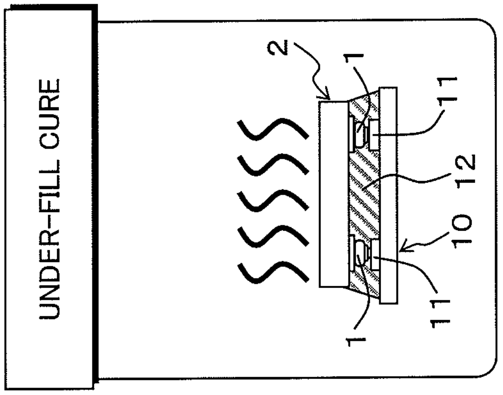

Although the semiconductor device of this embodiment has been described in the context of a semiconductor chip 2 including a plurality of bumps 1A-1E, this is not limiting. For example, a semiconductor device may include a semiconductor chip 2 including above-described plural bumps 1 and a mounting board 10 including surface electrodes 11, and the surface electrodes 11 of the mounting board 10 and the plurality of bumps 1 of the semiconductor chip 2 may be bonded together, as depicted in FIGS. 2A and 2B. More specifically, a semiconductor device may be such that the semiconductor chip 2 including the plurality of bumps 1 may be mounted over the mounting board 10 by bonding the surface electrodes 11 of the mounting board 10 and the plurality of bumps 1 of the semiconductor chip 2 together. In such a case, for reinforcing the connections after the bonding, under-fill material (resin encapsulation material) 12 may be filled between the semiconductor chip 2 and the mounting board 10, as depicted in FIGS. 2A and 2B. More specifically, after injecting the under-fill material 12 between the semiconductor chip 2 and the mounting board 10, as depicted in FIG. 2A, the under-fill material (under-fill) 12 may be allowed to cure, as depicted in FIGS. 2A and 2B.

Next, a method of manufacturing a semiconductor device according to this embodiment will be described.

Initially, a plurality of bumps 1A-1E are formed over the surface 3B of a semiconductor element 3 (see FIG. 1).

Here, the semiconductor element 3 includes an integrated circuit (not illustrated) and surface electrode 5. The semiconductor element 3 is a semiconductor element, made from a semiconductor material, such as gallium arsenide or silicon, for example.

Over the surface 3B of the semiconductor element 3, there are a plurality of (five in the drawing) steps (the surface is not flat). More specifically, there are a plurality of (five in the drawing) bump formation faces 4A-4E, that are distanced from the back surface 3A of the semiconductor element 3 at the different distance, over the surface 3B of the semiconductor element 3. On these plural bump formation faces 4A-4E, the bumps 1A-1E having different diameters are formed. In other words, the diameters of the bumps 1 are varied in accordance with the magnitudes of protrusion of the bumps 1, i.e., the distances of the bump formation faces 4 from the back surface 3A of the semiconductor element 3. In this embodiment, only the diameters of the bumps 1 undergoing excessive force are increased. In this embodiment, the plurality of bumps 1 are formed with metal plating. Note that the bumps 1 are preferably formed using metal including at least gold or copper. Alternatively, the bumps 1 may be stud bumps formed from metal wires, for example. For forming the bumps 1 with different diameters economically, metal plating bumps formed with plating are preferred.

Assuming that a second distance is longer than a first distance, for increasing bonding areas, a second bump formed on a second bump formation face, which is distanced from the back surface 3A of the semiconductor element 3 at the second distance, may be configured to have a larger diameter than that of a first bump formed on a first bump formation face, which is distanced from the back surface 3A of the semiconductor element 3 at the first distance. Furthermore, assuming that a third distance is shorter than the first distance, a third bump formed on a third bump formation face, which is distanced from the back surface 3A of the semiconductor element 3 at the third distance, may be configured to have a smaller diameter than that of the first bump.

In this manner, the semiconductor chip 2 including the plurality of bumps 1 (semiconductor device) is fabricated (see FIG. 1).

Subsequently, the plurality of bumps 1 of the semiconductor chip 2 and the surface electrodes 11 of the mounting board 10 are bond together (see FIGS. 2A and 2B).

In this embodiment, the plurality of bumps 1 of the semiconductor chip 2 and the surface electrodes 11 of the mounting board 10 are bonded using ultrasonic bonding.

Note that the plurality of bumps 1 of the semiconductor chip 2 and the surface electrodes 11 of the mounting board 10 may be bonded together under a force. Specifically, the plurality of bumps 1 of the semiconductor chip 2 and the surface electrodes 11 of the mounting board 10 may be bonded together under a force of approximately 0.05 N or more per bump. For example, as low-cost bonding techniques utilizing metal bumps of the semiconductor chip 2, e.g., plating bumps and stud bumps, there are thermo compression bonding, pressure bonding, and ultrasonic bonding. All of these bonding techniques apply a force during bonding. Forces applied during thermo compression bonding and pressure bonding range from approximately 0.2 N to about 1 N per bump, while forces applied during ultrasonic bonding range from about 0.05N to approximately 0.3 N per bump.

Thereafter, under-fill material (resin encapsulation material) 12 is filled between the semiconductor chip 2 and the mounting board 10 by injecting the under-fill material 12 between the semiconductor chip 2 and the mounting board 10 and allowing it to cure (see FIGS. 2A and 2B). Note that such a filing step of the under-fill material 12 may be done prior to bonding.

In this embodiment, the semiconductor chip 2 including the plurality of bumps 1 is a semiconductor chip 2 including an interconnection layer 7 including at least one conductor layer 6 (e.g., multi-layered interconnection layer) over the surface of the semiconductor element 3 (see FIG. 1), as described previously. In such a case, the bump formation faces 4 are located on the surface of the interconnection layer 7.

Especially, in this embodiment, the semiconductor chip 2 including the plurality of bumps 1 is a semiconductor chip 2 including a wafer level package 9 (see FIG. 1), as described previously. In such a case, the bump formation faces 4 are located over the surface of the wafer level package 9 (the interconnection layer 7).

The interconnection layer 7 also includes an interconnection 6A and an interconnection electrode 6B as a conductor layer 6, and further includes a protection layer 8 including a photosensitive polybenzoxazole or a photosensitive polyimide, for example.

In such case, a method of manufacturing a semiconductor device of the embodiment includes following steps.

If the semiconductor chip 2 including the plurality of bumps 1 is a semiconductor chip 2 including an interconnection layer 7 including at least one conductor layer 6 (e.g., multi-layered interconnection layer) over the surface of a semiconductor element 3, the interconnection layer 7 including at least one conductor layer 6 (e.g., multi-layered interconnection layer) is formed over the semiconductor element 3, before formation of the plurality of bumps 1 over the surface 3B of the semiconductor element 3 (see FIG. 1).

Alternatively, if the semiconductor chip 2 including the plurality of bumps 1 is a semiconductor chip 2 including a wafer level package 9, the wafer level package 9 is formed over the semiconductor element 3 in the form of a wafer, before formation of the plurality of bumps 1 over the surface 3B of the semiconductor element 3. In other words, the wafer level package 9 is formed over the semiconductor element 3 in the form of a wafer by forming an interconnection layer 7 including at least one conductor layer 6 (e.g., multi-layered interconnection layer) at wafer level. In this manner, the semiconductor element 3 in the form of a wafer is converted to the wafer level package 9.

There are a plurality of (five in the drawing) steps (the surface is not flat) on the surface of the interconnection layer 7 formed over the semiconductor element 3 in the above-described steps (see FIG. 1). More specifically, there are a plurality of (five in the drawing) bump formation faces 4, that are distanced from the back surface 3A of the semiconductor element 3 at the different distance, over the surface of the interconnection layer 7 formed over the semiconductor element 3.

In the case of a semiconductor chip 2 having an interconnection layer 7 including at least one conductor layer 6 over the surface 3B of the semiconductor element 3, the bump formation faces 4 are located on the surface of the interconnection layer 7. Especially in the case of a semiconductor chip 2 including a wafer level package 9, the bump formation faces 4 are located on the surface of the wafer level package 9 (the interconnection layer 7).

Accordingly, if the semiconductor chip 2 including the plurality of bumps 1 is a semiconductor chip 2 including an interconnection layer 7 including at least one conductor layer 6 over the surface 3B of a semiconductor element 3, the plurality of bumps 1 having different diameters are formed on the plurality of bump formation surfaces 4 defining a part of the surface of the interconnection layer 7. Alternatively, if the semiconductor chip 2 including the plurality of bumps 1 is a semiconductor chip 2 including a wafer level package 9, the plurality of bumps 1 having different diameters are formed on the plurality of bump formation surfaces 4 defining apart of the surface of the wafer level package 9 (the interconnection layer 7).

If the semiconductor chip 2 including the plurality of bumps 1 is a semiconductor chip 2 including a wafer level package 9, by dicing the wafer into individual chips after forming the plurality of bumps 1 having different diameters on the plurality of bump formation surfaces 4 defining a part of the surface of the wafer level package 9 (the interconnection layer 7), as described above, the semiconductor chip 2 including the plurality of bumps 1 and the wafer level package 9 is formed (see FIG. 1). In such a case, the semiconductor chip 2 having the wafer level package 9 will be mounted on the mounting board 10 by bonding the plurality of bumps 1 of the semiconductor chip 2 having the wafer level package 9 and the surface electrodes 11 of the mounting board 10 together.

Hereinafter, a first specific example of a method of manufacturing a semiconductor device of the embodiment will be described with reference to FIGS. 3-9.

Here, an example in which plating bumps 1 are formed over a semiconductor chip 2 including a wafer level package 9 will be explained. In such a case, a plurality of bump formation faces 4 are located on the surface of the wafer level package 9 (the interconnection layer 7). This example will be described in the context in which a semiconductor element 3 is a gallium arsenide wafer 3X, a plating bump 1A having the largest diameter is formed on a bump formation face 4A that is distanced from the back surface 3XA of the gallium arsenide wafer 3X at the largest distance, and a plating bump 1E having smallest diameter is formed on a bump formation face 4E that is distanced from the back surface 3XA of the gallium arsenide wafer 3X at the smallest distance.

Figures 3A, 3B, 3C, 3D:
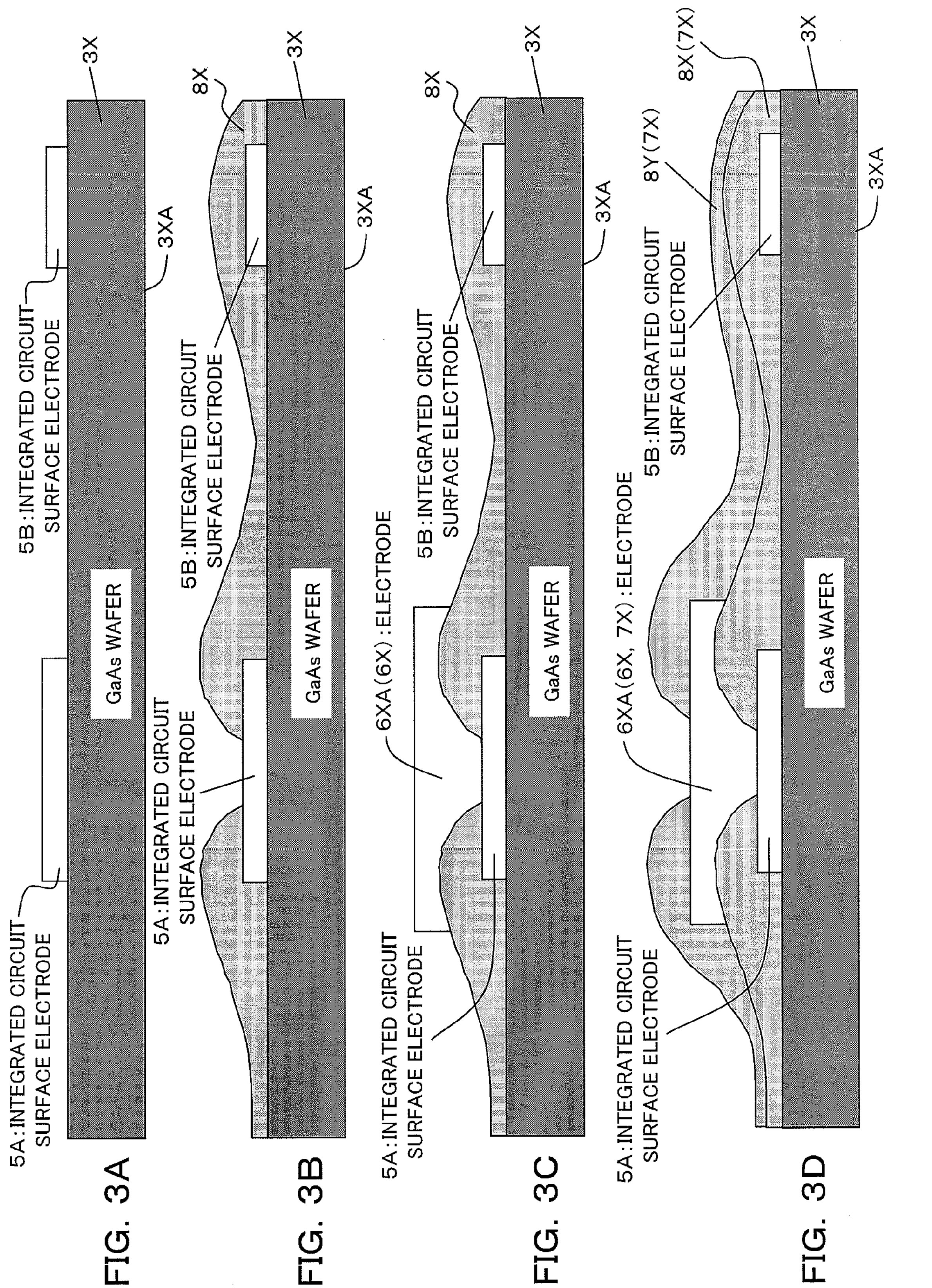
FIGS. 3A-3D are schematic cross-sectional views illustrating a first specific example of a method of manufacturing a semiconductor device according to one embodiment.

Initially, as depicted in FIG. 3A, an about 0.4-mm-thick gallium arsenide wafer (semiconductor element) 3X having an integrated circuit (not illustrated) and surface electrodes 5A and 5B (surface electrodes for the integrated circuit, for example gold electrodes) formed thereabove in the form of a wafer, is provided.

Subsequently, as depicted in FIG. 3B, over the gallium arsenide wafer 3X, a protection layer 8X having a thickness of about 3 μm, for example, and having a via with a diameter of about 15 μm over the surface electrode 5A is formed, from a photosensitive polybenzoxazole, for example.

Subsequently, although not illustrated, a seed layer having a thickness of about 0.2 μm, for example, is formed, such as by sputtering, using titanium tungsten/gold, for example. As used herein, the "titanium tungsten/gold" refers to sputtering titanium tungsten, followed by sputtering of gold, without breaking vacuum. Any material including a slash "/" refers to a similarly formed material. In addition, the "thickness of about 0.2 μm" is the combined thickness of titanium tungsten and gold.

Thereafter, as depicted in FIG. 3C, a gold interconnection (not illustrated) having a film thickness of about 3 μm and a line width of about 20 μm, for example, is formed, as a first-level interconnection 6X, using photolithography and electroplating, for example. In this step, the via in the protection layer 8X over the surface electrode 5A over the gallium arsenide wafer 3X is filled with gold, thereby forming a gold electrode 6XA as an electrode in the first-level interconnection 6X. Note that the first-level gold interconnection (not illustrated) and the gold electrode 6XA are collectively referred to as a conductor layer. Additionally, the gold electrode 6XA is referred to as an interconnection electrode (redistribution layer electrode).

Again, as depicted in FIG. 3D, a protection layer 8Y having a thickness of about 3 μm, for example, and having a via with a diameter of about 15 μm over the gold electrode 6XA of the first-level interconnection 6X is formed, from a photosensitive polybenzoxazole, for example.

Thereby, a first-level interconnection layer 7X including the first-level gold interconnection (not illustrated), the gold electrode 6XA, and the protection layers 8X and 8Y, is formed.

Subsequently, although not illustrated, a seed layer having a thickness of about 0.2 μm, for example, is formed, such as by sputtering, using titanium tungsten/gold, for example.

Figure 4:
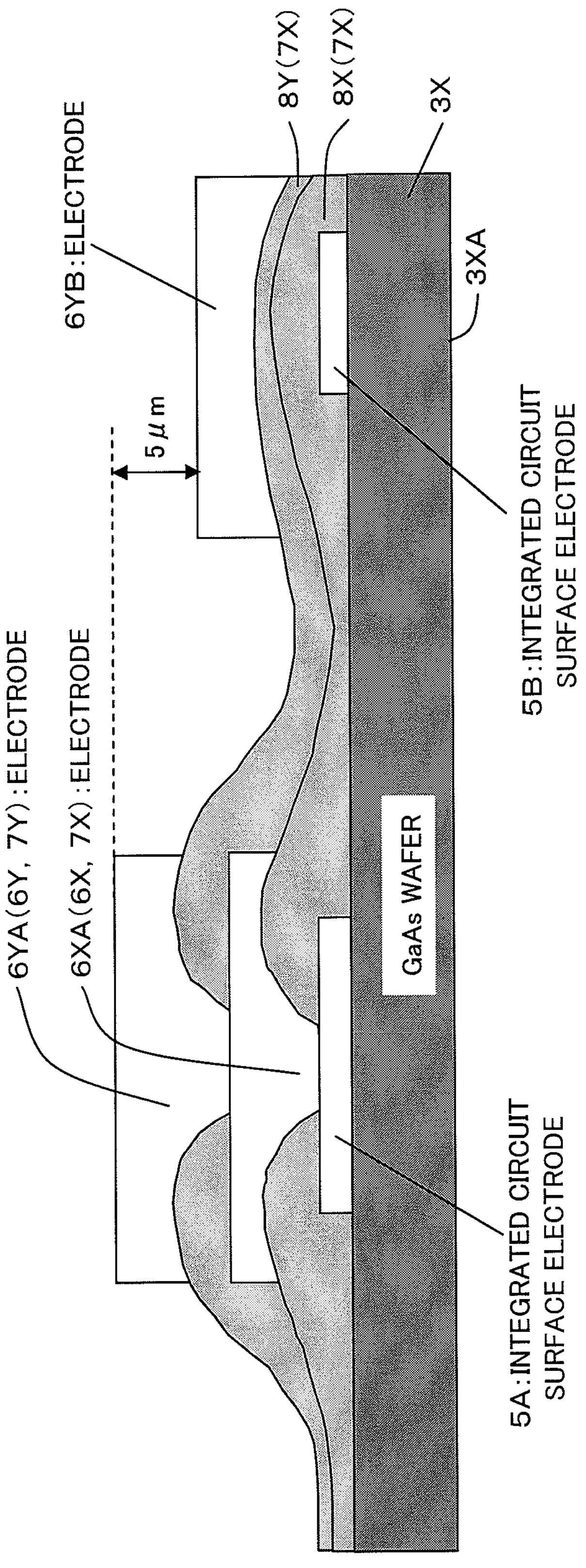
FIG. 4 is a schematic cross-sectional view illustrating the first specific example of a method of manufacturing a semiconductor device according to one embodiment.

Thereafter, as depicted in FIG. 4, a gold interconnection (not illustrated) having a film thickness of about 3 μm and a line width of about 20 μm, for example, is formed, as a second-level interconnection 6Y, using photolithography and electroplating, for example. In this step, the via in the protection layer 8Y on the gold electrode 6XA for the first-level interconnection 6X is filled with gold, thereby forming a gold electrode 6YA as an electrode for the second-level interconnection 6Y. In addition, a gold electrode 6YB is formed on the surface of the protection layer 8Y over the surface electrode 5B on the gallium arsenide wafer 3X, as an electrode for the second-level interconnection 6Y. Note that the second-level gold interconnection (not illustrated) and the gold electrodes 6YA and 6YB are collectively referred to as a conductor layer. Additionally, the gold electrodes 6YA and 6YB are referred to as an interconnection electrode (redistribution layer electrode). Note that the second-level gold electrodes 6YA and 6YB are surface electrodes for a redistribution layer in this embodiment.

At this stage, the thicknesses from the back surface (backside) 3XA of the gallium arsenide wafer 3X to the surfaces of the redistribution layer surface electrodes 6YA and 6YB were measured, and the difference between the maximum and minimum thicknesses was about 5 μm.

Subsequently, as depicted in FIGS. 5A and 5B, again, a protection layer 8Z having a thickness of about 3 μm, and having vias 8ZA and 8ZB of a diameter of about 40 μm over the gold electrodes 6YA and 6YB, as the surface electrodes, is formed, from a photosensitive polybenzoxazole, for example.

Thereby, a second-level interconnection layer 7Y including the second-level gold interconnection (not illustrated), the gold electrodes 6YA and 6YB, and the protection layer 8Z, is formed.

In this manner, the redistribution layer 7 (the wafer level package 9, dual-layered interconnection layer in this case) is formed over the gallium arsenide wafer 3X. In such a case, the plurality of bump formation faces 4 are located on the surface of the redistribution layer 7, i.e., over the surface of the wafer level package 9. In this embodiment, the surface of the surface electrode 6YA in the redistribution layer 7 defines a bump formation face 4A that is distanced from the back surface 3XA of the gallium arsenide wafer 3X at the largest distance. Additionally, the surface of the surface electrode 6YB in the redistribution layer 7 defines a bump formation face 4E that is distanced from the back surface 3XA of the gallium arsenide wafer 3X at the smallest distance.

Subsequently, as depicted in FIGS. 5C and 5D, a seed layer 13 with a thickness of about 0.2 μm, for example, is formed, such as by sputtering, using titanium tungsten/gold, for example, over the surface of the redistribution layer 7 formed in the processes described above.

Thereafter, as depicted in FIGS. 6-9, plating bumps 1 are formed over the respective redistribution layer surface electrodes 6YA and 6YB, sandwiching the seed layer 13 therebetween, using photolithography, for example.

Hereinafter, only steps for forming a plating bump 1A of the largest diameter and a plating bump 1E of smallest diameter will be illustrated and described. In other words, only steps for forming the plating bump 1A to be formed on the surface of the bump formation face 4A that is distanced from the back surface 3XA of the gallium arsenide wafer 3X at the largest distance, i.e., the surface of the surface electrode 6YA in the redistribution layer 7, and the plating bump 1E to be formed on the surface of the bump formation face 4E that is distanced from the back surface 3XA of the gallium arsenide wafer 3X at the smallest distance, i.e., the surface of the surface electrode 6YB in the redistribution layer 7, will be illustrated and described.

Figure 6B:
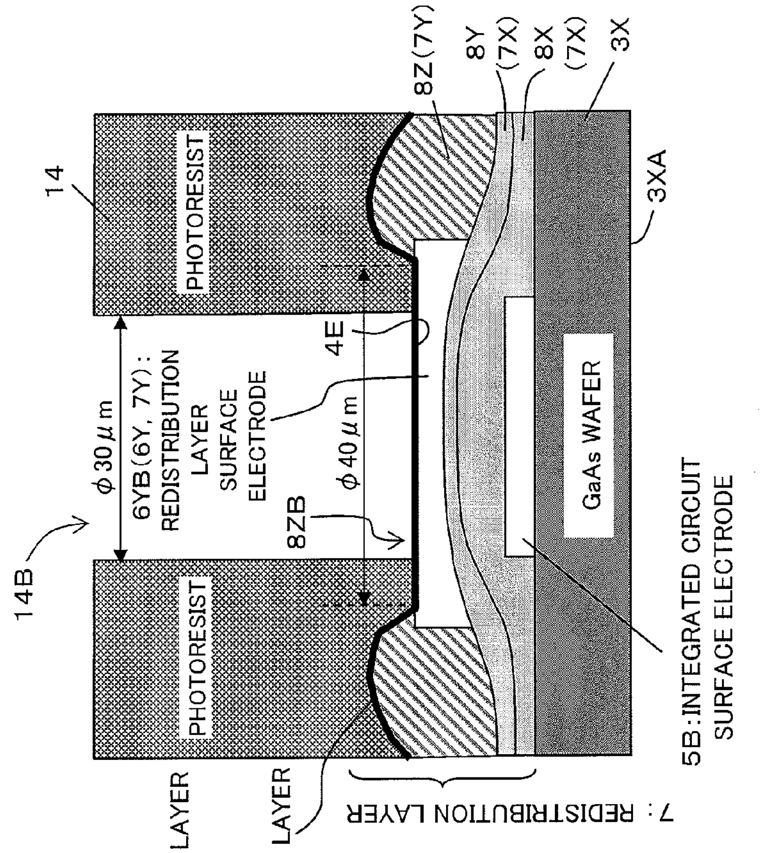
FIGS. 6A and 6B are schematic cross-sectional views illustrating the first specific example of a method of manufacturing a semiconductor device according to one embodiment.
Figure 6A:
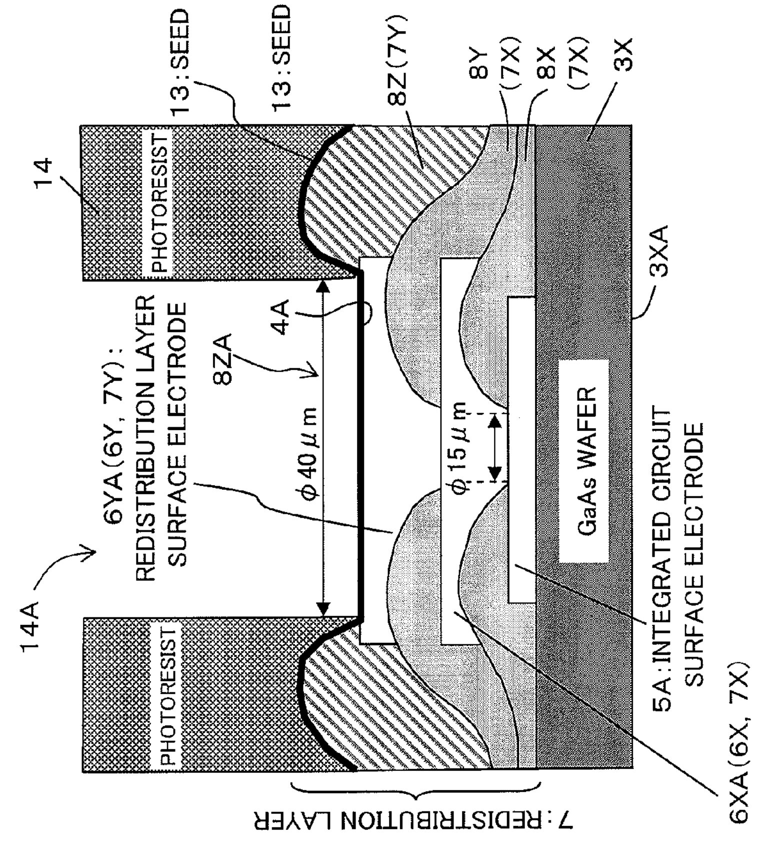

Specifically, initially, as depicted in FIGS. 6A and 6B, a photoresist 14 to be used for formation of plating bumps is formed in a film thickness of about 30 μm, for example. Thereafter, openings 14A and 14B are formed, using the photo mask, by varying the diameter in accordance with the thicknesses from the back surface 3XA of the gallium arsenide wafer 3X to the surfaces of the redistribution layer surface electrodes 6YA and 6YB, i.e., the positions of the bump formation faces 4A and 4E.

In this embodiment, the difference between the maximum and minimum thicknesses from the back surface 3XA of the gallium arsenide wafer 3X to the surfaces of the redistribution layer surface electrodes 6YA and 6YB was about 5 μm, as described previously. Thus, an opening 14A having an opening diameter of about 40 μm is formed over the redistribution layer surface electrode (6YA) which has a difference between the maximum and minimum thicknesses of about 2 μm. In other words, the opening 14A having an opening diameter of about 40 μm is formed over the redistribution layer surface electrode (6YA) which has a thickness from the back surface 3XA of the gallium arsenide wafer 3X to the surface of the redistribution layer surface electrode (6YA) equal to or greater than a certain value. Additionally, an opening 14B having an opening diameter of about 30 μm is formed over the redistribution layer surface electrode (6YB) which has a thickness between the maximum and minimum thicknesses larger than about 2 μm. In other words, the opening 14B having an opening diameter of about 30 μm is formed over the redistribution layer surface electrode (6YB) which has a thickness from the back surface 3XA of the gallium arsenide wafer 3X to the surface of the redistribution layer surface electrode (6YB) smaller than that certain value.

Figure 7B:
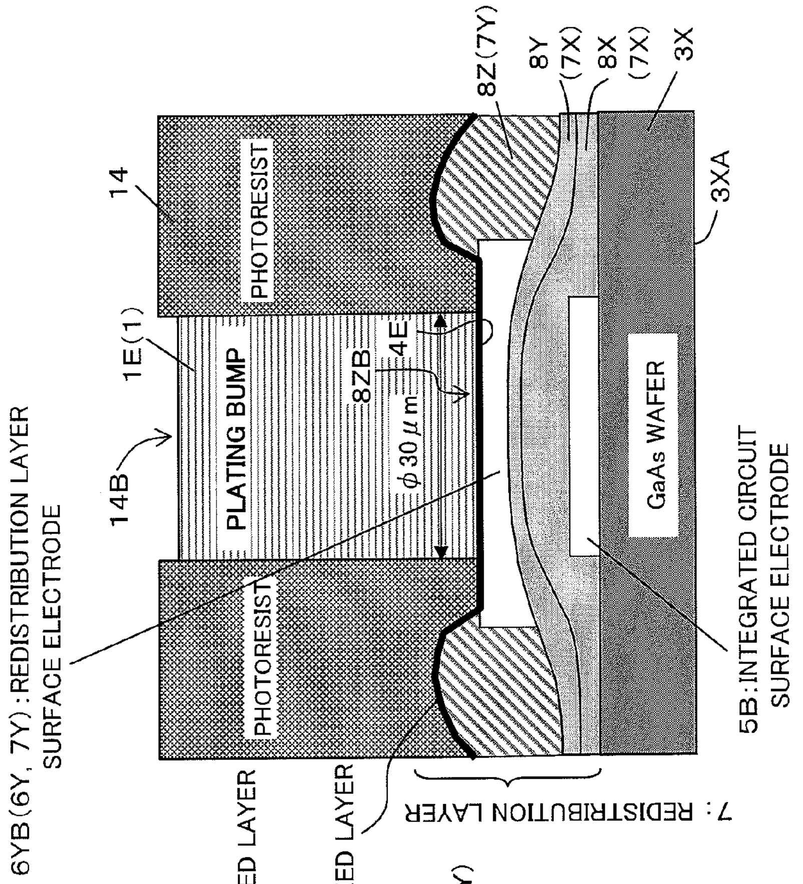
FIGS. 7A and 7B are schematic cross-sectional views illustrating the first specific example of a method of manufacturing a semiconductor device according to one embodiment.
Figure 7A:
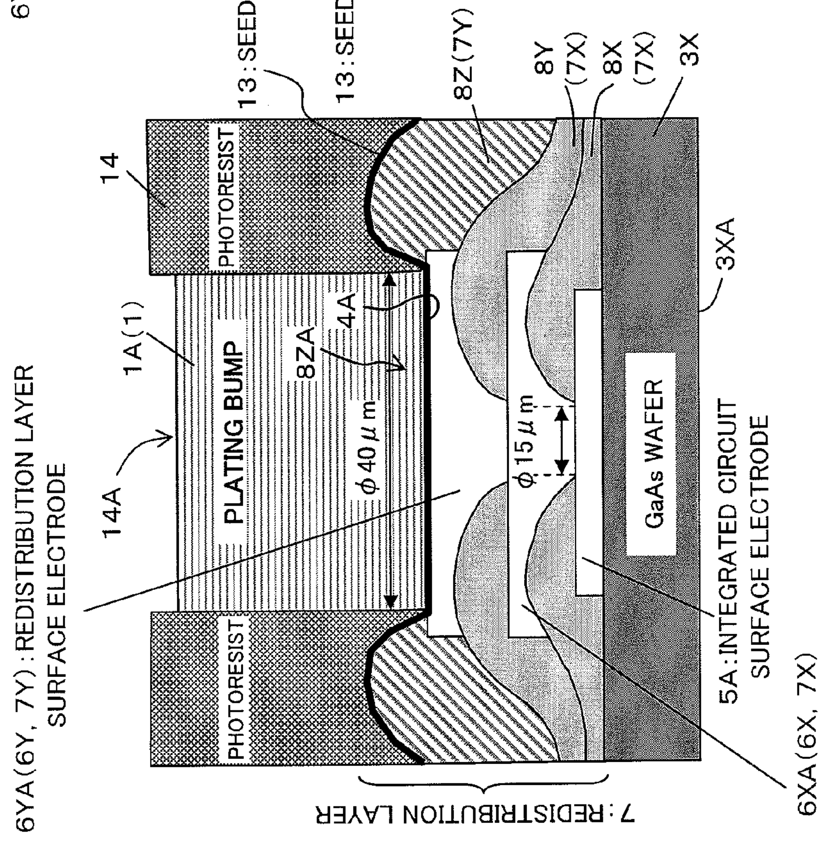

Thereafter, as depicted in FIGS. 7A and 7B, gold plating bumps 1A and 1E are formed by electroplating gold, for example, to a thickness of about 25 μm, for example, using the resist mask 14 having the openings 14A and 14B of different diameter, which has been formed in the processes described above. In this embodiment, the gold plating bump 1A has a diameter of about 40 μm and a cross-sectional area of 1256 μm². Additionally, the gold plating bump 1E has a diameter of about 30 μm and a cross-sectional area of 706.5 μm².

Figure 8A:
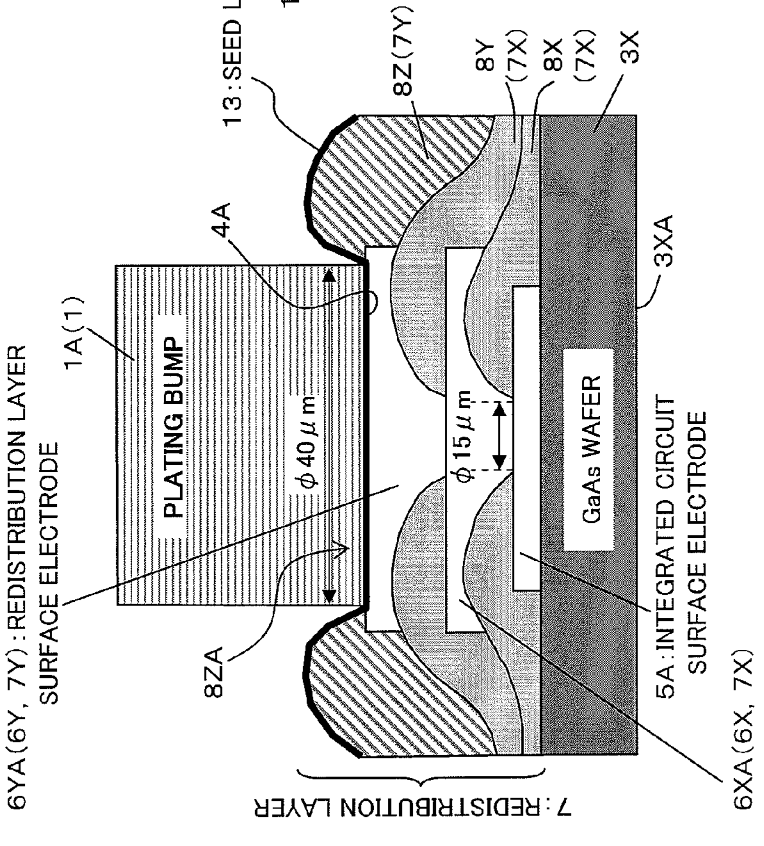
FIGS. 8A and 8B are schematic cross-sectional views illustrating the first specific example of a method of manufacturing a semiconductor device according to one embodiment.
Figure 8B:
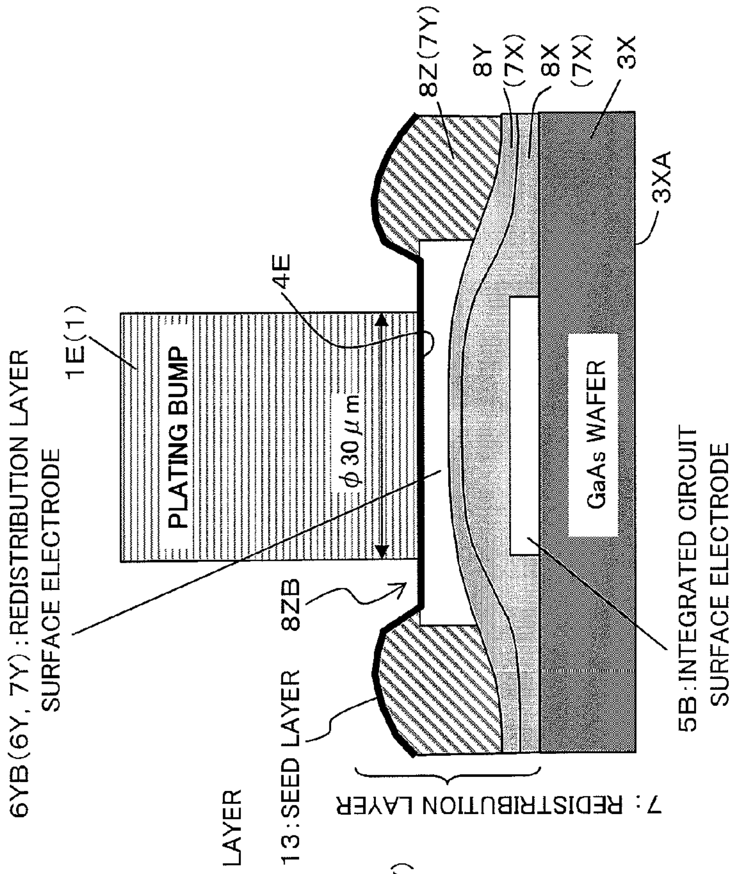
Figure 9A:
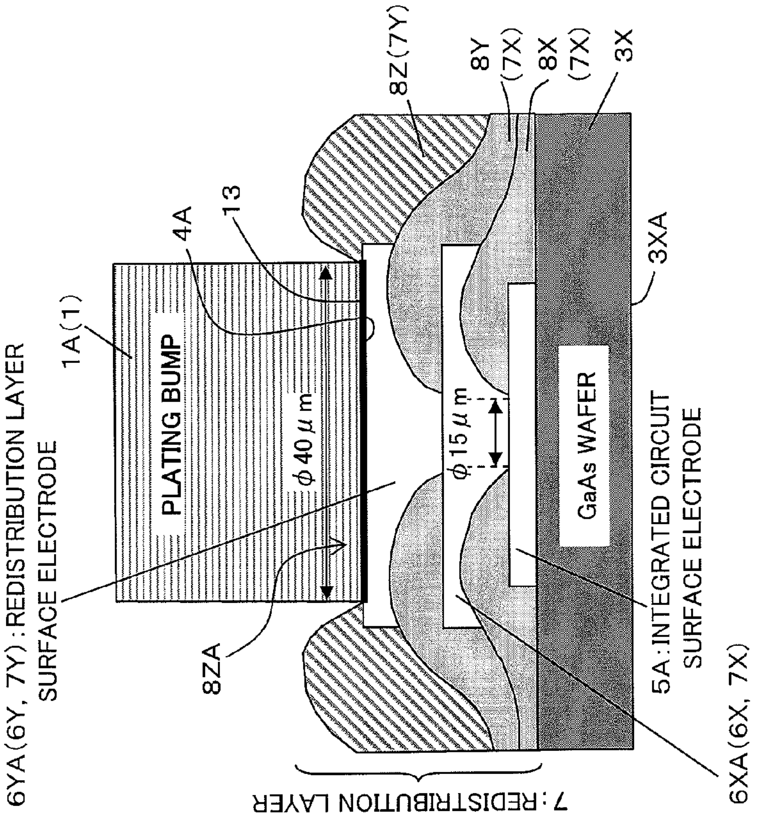
FIGS. 9A and 9B are schematic cross-sectional views illustrating the first specific example of a method of manufacturing a semiconductor device according to one embodiment.
Figure 9B:
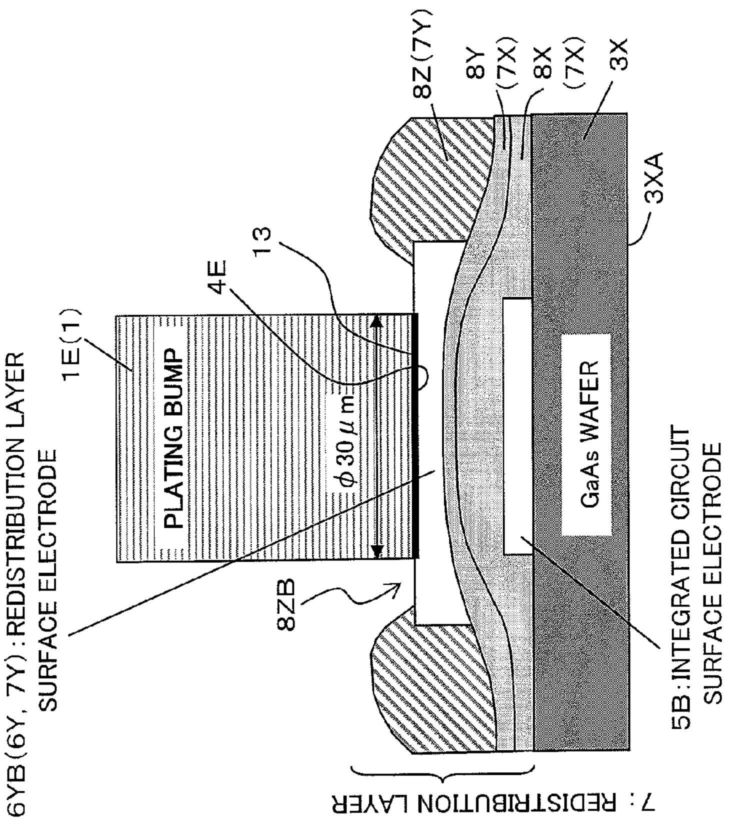

Finally, after the photoresist 14 is stripped away (removed) as depicted in FIGS. 8A and 8B, the seed layer 13 in the areas other than the areas, in which the gold plating bumps 1A and 1E are formed, is removed by etching, as depicted in FIGS. 9A and 9B. Thereafter, the wafer 3X is diced into individual chips to fabricate a semiconductor chip 2 (gallium arsenide chip) having the plurality of bumps 1 (see FIG. 1).

Subsequently, a mounting board 10 (resin package board) including gold electrodes 11, as surface electrodes, is provided (see FIGS. 2A and 2B).

Thereafter, the plurality of bumps 1 of the semiconductor chip 2 and the surface electrodes 11 of the mounting board 10 fabricated in the processes described above are ultrasonically bonded together to mount the semiconductor chip 2 on the mounting board 10. In this embodiment, the ultrasonic bonding is performed by applying ultrasounds of about 50 kHz for about 1.5 seconds under a force of about 0.1 N per bump.

In the steps described above, the semiconductor device of the first specific example of this embodiment has been fabricated.

Next, a second specific example of a method of manufacturing a semiconductor device of the embodiment will be explained.

Here, an example in which plating bumps 1 are formed over a semiconductor chip 2 including a wafer level package 9 will be explained. In such a case, the plurality of bump formation faces 4 are located on the surface of the wafer level package 9 (the interconnection layer 7). This example will be described in the context in which a semiconductor element 3 is a silicon wafer, a plating bump 1A having the largest diameter is formed on a bump formation face 4A that is distanced from the back surface of the silicon wafer at the largest distance, and a plating bump 1E having smallest diameter is formed on a bump formation face 4E that is distanced from the back surface of the silicon wafer at the smallest distance. In addition, this second specific example is different from the above-described first specific example, primarily in terms of the materials of a wafer (semiconductor element), electrodes, protection layers, seed layers, and the like. However, the steps in this second specific example are similar to those in the above-described first specific example. Accordingly, a wafer (semiconductor element), protection layers, seed layers, and the like, made from different materials are referenced to by the same reference symbols, and will be described with reference to the same drawings.

Initially, an about 0.6-mm-thick silicon wafer (semiconductor element) 3X having an integrated circuit (not illustrated) and surface electrodes 5A and 5B (surface electrodes for the integrated circuit, for example gold electrodes) formed thereabove in the form of a wafer, is provided (see FIG. 3A).

Subsequently, over the silicon wafer 3X, a protection layer 8X having a thickness of about 3 μm, for example, and having a via with a diameter of about 15 μm over the surface electrode 5A is formed, from a photosensitive polyimide, for example (see FIG. 3B).

Subsequently, although not illustrated, a seed layer having a thickness of about 0.2 μm, for example, is formed, such as by sputtering, using titanium/copper or titanium tungsten/copper, for example.

Thereafter, a copper interconnection (not illustrated) having a film thickness of about 5 μm and a line width of about 20 μm, for example, is formed, as a first-level interconnection 6X, using photolithography and electroplating, for example (see FIG. 3C). In this step, the via in the protection layer 8X over the surface electrode 5A over the silicon wafer 3X is filled with copper, thereby forming a copper electrode 6XA as an electrode in the first-level interconnection 6X. Note that the first-level copper interconnection (not illustrated) and the copper electrode 6XA are collectively referred to as a conductor layer. Additionally, the copper electrode 6XA is referred to as an interconnection electrode (redistribution layer electrode).

Subsequently, again, a protection layer 8Y having a thickness of about 3 μm, for example, and having a via with a diameter of about 15 μm over the copper electrode 6XA of the first-level interconnection 6X is formed, from a photosensitive polyimide, for example (see FIG. 3D).

Thereby, a first-level interconnection layer 7X including the first-level copper interconnection (not illustrated), the copper electrode 6XA, and the protection layers 8X and 8Y, is formed.

Subsequently, although not illustrated, a seed layer having a thickness of about 0.2 μm, for example, is formed, such as by sputtering, using titanium/copper or titanium tungsten/copper, for example.

Thereafter, a copper interconnection (not illustrated) having a film thickness of about 5 μm and a line width of about 20 μm, for example, is formed, as a second-level interconnection 6Y, using photolithography and electroplating, for example (see FIG. 4). In this step, the via in the protection layer 8Y over the copper electrode 6XA for the first-level interconnection 6X is filled with copper, thereby forming a copper electrode 6YA as an electrode for the second-level interconnection 6Y. In addition, a copper electrode 6YB is formed over the surface of the protection layer 8Y over the surface electrode 5B over the silicon wafer 3X, as an electrode for the second-level interconnection 6Y. Note that the second-level copper interconnection (not illustrated) and the copper electrodes 6YA and 6YB are collectively referred to as a conductor layer. Additionally, the copper electrodes 6YA and 6YB are referred to as an interconnection electrode (redistribution layer electrode). Note that the second-level copper electrodes 6YA and 6YB are surface electrodes for a redistribution layer in this embodiment.

At this stage, the distances from the back surface (backside) 3XA of the silicon wafer 3X to the surfaces of the redistribution layer surface electrodes 6YA and 6YB were measured, and the difference between the maximum and minimum thicknesses was about 5 μm.

Subsequently, again, a protection layer 8Z having a thickness of about 3 μm, and having vias 8ZA and 8ZB of a diameter of about 40 μm over the copper electrodes 6YA and 6YB, as the surface electrodes, is formed, from a photosensitive polyimide, for example (see FIGS. 5A and 5B).

Thereby, a second-level interconnection layer 7Y including the second-level copper interconnection (not illustrated), the copper electrodes 6YA and 6YB, and the protection layer 8Z, is formed.

In this manner, the redistribution layer 7 (the wafer level package 9, dual-layered interconnection layer in this case) is formed over the silicon wafer 3X. In such a case, the plurality of bump formation faces 4 are located on the surface of the redistribution layer 7, i.e., on the surface of the wafer level package 9. In this embodiment, the surface of the surface electrode 6YA in the redistribution layer 7 defines a bump formation face 4A that is the most distanced from the back surface 3XA of the silicon wafer 3X at the largest distance. Additionally, the surface of the surface electrode 6YB in the redistribution layer 7 defines a bump formation face 4E that is distanced from the back surface 3XA of the silicon wafer 3X at the smallest distance.

Subsequently, a seed layer 13 with a thickness of about 0.2 μm, for example, is formed, such as by sputtering, using titanium/gold or titanium tungsten/gold, for example, on the surface of the redistribution layer 7 formed in the processes described above (see FIGS. 5C and 5D).

Thereafter, as depicted in FIGS. 6-9, plating bumps 1 are formed over the respective redistribution layer surface electrodes 6YA and 6YB, sandwiching the seed layer 13 therebetween, using photolithography, for example.

Hereinafter, only steps for forming a plating bump 1A of the largest diameter and a plating bump 1E of smallest diameter will be illustrated and described. In other words, only steps for forming the plating bump 1A to be formed on the surface of the bump formation face 4A that is distanced from the back surface 3XA of the silicon wafer 3X at the largest distance, i.e., the surface of the surface electrode 6YA in the redistribution layer 7, and the plating bump 1E to be formed on the surface of the bump formation face 4E that is distanced from the back surface 3XA of the silicon wafer 3X at the smallest distance, i.e., the surface of the surface electrode 6YB in the redistribution layer 7, will be illustrated and described.

Specifically, initially, a photoresist 14 to be used for formation of plating bumps is formed in a film thickness of about 30 μm, for example. Thereafter, openings 14A and 14B are formed, using the photo mask, by varying the diameter in accordance with the thicknesses from the back surface 3XA of the silicon wafer 3X to the surfaces of the redistribution layer surface electrodes 6ZY and 6YB, i.e., the positions of the bump formation faces 4A and 4E (see FIGS. 6A and 6B).

In this embodiment, the difference between the maximum and minimum thicknesses from the back surface 3XA of the silicon wafer 3X to the surfaces of the redistribution layer surface electrodes 6YA and 6YB was about 5 μm, as described previously. Thus, an opening 14A having an opening diameter of about 50 μm is formed over the redistribution layer surface electrode (6YA) which has a difference between the maximum and minimum thicknesses of about 2 μm. In other words, the opening 14A having an opening diameter of about 50 μm is formed over the redistribution layer surface electrode (6YA) which has a thickness from the back surface 3XA of the silicon wafer 3X to the surface of the redistribution layer surface electrode (6YA) equal to or greater than a certain value. Additionally, an opening 14B having an opening diameter of about 40 μm is formed over the redistribution layer surface electrode (6YB) which has a difference between the maximum and minimum thicknesses larger than about 2 μm. In other words, the opening 14B having an opening diameter of about 40 μm is formed over the redistribution layer surface electrode (6YB) which has a thickness from the back surface 3XA of the silicon wafer 3X to the surface of the redistribution layer surface electrode (6YB) smaller than that certain value.

Thereafter, gold plating bumps 1A and 1E are formed by electroplating gold, for example, to a thickness of about 25 μm, for example, using the resist mask 14 having the openings 14A and 143 of different diameter, which has been formed in the processes described above (see FIGS. 7A and 7B). In this embodiment, the gold plating bump 1A has a diameter of about 50 μm and a cross-sectional area of 1962.5 $\mu m^2$. Additionally, the gold plating bump 1E has a diameter of about 40 μm and a cross-sectional area of 1256 $\mu m^2$.

Finally, after the photoresist 14 is stripped away (removed) (see FIGS. 8A and 83), the seed layer 13 in the areas other than the areas, in which the gold plating bumps 1A and 1E are formed, is removed by etching (see FIGS. 9A and 9B). Then, after polishing the backside 3XA of the wafer 3X, the wafer 3X is diced into individual chips to fabricate a semiconductor chip 2 (silicon chip) having the plurality of bumps 1 (see FIG. 1).

Subsequently, a mounting board 10 (resin package board) including gold electrodes 11, as surface electrodes, is provided (see FIGS. 2A and 2B).

Thereafter, the plurality of bumps 1 of the semiconductor chip 2 and the surface electrodes 11 of the mounting board 10 fabricated in the processes described above are ultrasonically bonded together to mount the semiconductor chip 2 on the mounting board 10. In this embodiment, the ultrasonic bonding is performed by applying ultrasounds of about 50 kHz for about 2 seconds under a force of about 0.1 N per bump.

In the steps described above, the semiconductor device of the second specific example of this embodiment has been fabricated.

Thus, a semiconductor device and a method of manufacturing the same of the embodiment have an advantage in that sufficient bonding strength are obtained for all bumps when bonding to a mounting board 10 even when the tops (the positions of the tops) of the bumps 1, i.e., the magnitudes of protrusion of the bumps 1 vary. They also have another advantage of being able to realize a semiconductor device including highly reliable bonds.

For evaluating the reliability of a semiconductor device manufactured according to the first specific example of a method of manufacturing a semiconductor device described above, the shear strengths of the bumps were measured, and the evaluation results listed in FIG. 10 were obtained.

As depicted in FIG. 10, all plating bumps (bump numbers 1-12) provided excellent shear strengths of approximately 0.2 N or more per bump, regardless of the thicknesses from the back surface (chip backside) of a gallium arsenide chip to the surfaces of redistribution layer surface electrodes, i.e., the positions of bump formation faces.

For comparison, a semiconductor device of a first comparative example was also manufactured in the manner similar to the first specific example of a method of manufacturing a semiconductor device described above, except that openings having the equal diameter (diameter of about 30 μm, in this example) were formed in a resist mask 14 to be used for formation of forming plating bumps 1. The shear strengths of the bumps were similarly measured for evaluating the reliability of the semiconductor device of the first comparative example, and the evaluation results listed in FIG. 11 were obtained.

As depicted in FIG. 11, only plating bumps (bump numbers 1-6) formed over redistribution layer surface electrodes, having smaller thicknesses from the back surface of a gallium arsenide chip to the surfaces of redistribution layer surface electrodes, provided excellent shear strengths of approximately 0.2 N or more per bump. In other words, plating bumps (bump numbers 7-12) formed over the redistribution layer surface electrodes, having larger thicknesses from the back surface of the gallium arsenide chip to the surfaces of redistribution layer surface electrodes, provided only poor shear strengths of approximately 0.13 N or less per bump.

For study, the bonding areas of the semiconductor device of the first comparative example were measured, and the plating bumps (bump numbers 1-6) formed over the redistribution layer surface electrodes, having smaller thicknesses from the back surface of the gallium arsenide chip to the surfaces of redistribution layer surface electrodes, had bonding areas of about 900 $\mu m^2$. In contrast, the plating bumps (bump numbers 7-12) formed over the redistribution layer surface electrodes, having larger thicknesses from the back surface of the gallium arsenide chip to the surfaces of redistribution layer surface electrodes, had bonding areas of about 400 $\mu m^2$. As described above, the plating bumps (bump numbers 7-12) formed over the redistribution layer surface electrodes, having larger thicknesses from the back surface of the gallium arsenide chip to the surfaces of redistribution layer surface electrodes did not provide sufficient shear strengths (bonding strengths) since sufficient bonding areas were not obtained.

For comparison, the bonding areas of the semiconductor device of the above-described first specific example were measured, and the plating bumps (bump numbers 1-6) formed over the redistribution layer surface electrodes, having smaller thicknesses from the back surface of the gallium arsenide chip to the surfaces of redistribution layer surface electrodes, had bonding areas of about 900 $\mu m^2$. Furthermore, the plating bumps (bump numbers 7-12) formed over the redistribution layer surface electrodes, having larger thicknesses from the back surface of the gallium arsenide chip to the surfaces of redistribution layer surface electrodes, had bonding areas of about 1200 $\mu m^2$. As described above, the sufficient bonding areas could be obtained by increasing the bump diameters of the plating bumps (bump numbers 7-12) formed over the redistribution layer surface electrodes, having larger thicknesses from the back surface of the gallium arsenide chip to the surfaces of redistribution layer surface electrodes, to about 40 μm. This resulted in sufficient shear strengths (bonding strengths) for all of the plating bumps (bump numbers 1-12), as described previously.

Similarly, the shear strengths of the bumps were measured for evaluating the reliability of a semiconductor device of the above-described second specific example, and all plating bumps provided excellent shear strengths of approximately 0.2 N or more per bump, regardless of the thicknesses from the back surface of a silicon chip to the surfaces of redistribution layer surface electrodes, i.e. the positions of bump formation faces.

For comparison, a semiconductor device of a second comparative example was also manufactured in the manner similar to the second specific example of a method of manufacturing a semiconductor device described above, except that openings having the equal diameter (diameter of about 40 μm, in this example) were formed in a resist mask 14 to be used for formation of forming plating bumps 1. The shear strengths of the bumps were measured for evaluating the reliability of the semiconductor device of the second comparative example, and only plating bumps formed over redistribution layer surface electrodes, having smaller thicknesses from the back surface of the silicon chip to the surfaces of redistribution layer surface electrodes, provided excellent shear strengths of approximately 0.2 N or more per bump. In other words, plating bumps formed over the redistribution layer surface electrodes, having larger thicknesses from the back surface of the silicon chip to the surfaces of redistribution layer surface electrodes, provided only poor shear strengths of approximately 0.1 N or less per bump.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A method of manufacturing a semiconductor device, comprising:

forming a first bump that is located over a surface of the semiconductor element, on a first bump formation face distanced from a back surface of the semiconductor element at a first distance, and a second bump that is located over the surface of the semiconductor element, on a second bump formation face distanced from the back surface of the semiconductor element at a second distance being longer than the first distance, the second bump having a diameter larger than a diameter of the first bump; and bonding the first and second bumps and a surface electrode of a mounting board together.

2. The method of manufacturing a semiconductor device according to claim 1, wherein the bonding comprises bonding the first and second bumps and the surface electrode of the mounting board under a force.

3. The method of manufacturing a semiconductor device according to claim 2, wherein the bonding comprises bonding the first and second bumps and the surface electrode of the mounting board under a force of 0.05 N or more per bump.

4. The method of manufacturing a semiconductor device according to claim 1, wherein the bonding comprises ultrasonic bonding the first and second bumps and the surface electrode of the mounting board.

5. The method of manufacturing a semiconductor device according to claim 1, further comprising:

forming an interconnection layer including at least one conductor layer over the semiconductor element, before forming the first and second bumps; and forming the first bump on the first bump formation face defining a part of a surface of the interconnection layer, and forming the second bump on the second bump formation face defining a part of a surface of the interconnection layer.

6. The method of manufacturing a semiconductor device according to claim 5, wherein the forming the interconnection layer comprises forming a multi-layered interconnection layer.

7. The method of manufacturing a semiconductor device according to claim 1, wherein converting the semiconductor element as a wafer to a wafer level package, before forming the first and second bumps;

forming the first bump on the first bump formation face defining a part of a surface of the wafer level package, and forming the second bump on the second bump formation face defining a part of a surface of the wafer level package;

forming a semiconductor chip comprising the first bump, the second bump, and the wafer level package by performing dicing after forming the first and second bumps; and mounting the semiconductor chip comprising the wafer level package on the mounting board by bonding the first and second bumps and the surface electrode of the mounting board together.

8. The method of manufacturing a semiconductor device according to claim 1, wherein the forming the first and second bumps comprises forming the first and second bumps by plating a metal.

9. The method of manufacturing a semiconductor device according to claim 1, wherein the forming the first and second bumps comprises forming the first and second bumps from a metal including at least gold or copper.

10. The method of manufacturing a semiconductor device according to claim 1, wherein the forming the first and second bumps further comprising forming a third bump that is located over the surface of the semiconductor element, on a third bump formation face distanced from the back surface of the semiconductor element at a third distance being shorter than the first distance, the third bump having a diameter smaller than the diameter of the first bump.

* * * * *